United States Patent
Iwata

(10) Patent No.: US 9,464,367 B2
(45) Date of Patent: Oct. 11, 2016

(54) METHOD FOR PRODUCING N-TYPE GROUP III NITRIDE SINGLE CRYSTAL, N-TYPE GROUP III NITRIDE SINGLE CRYSTAL, AND CRYSTAL SUBSTRATE

(71) Applicant: Hirokazu Iwata, Miyagi (JP)

(72) Inventor: Hirokazu Iwata, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 101 days.

(21) Appl. No.: 14/474,924

(22) Filed: Sep. 2, 2014

(65) Prior Publication Data
US 2014/0369917 A1   Dec. 18, 2014

Related U.S. Application Data

(62) Division of application No. 13/220,939, filed on Aug. 30, 2011, now Pat. No. 8,858,908.

(30) Foreign Application Priority Data

Aug. 31, 2010  (JP) ................. 2010-194552
Jul. 7, 2011   (JP) ................. 2011-151093

(51) Int. Cl.
| C30B 29/40 | (2006.01) |
| C30B 9/10  | (2006.01) |
| H01B 1/06  | (2006.01) |
| C30B 9/00  | (2006.01) |

(Continued)

(52) U.S. Cl.
CPC .............. C30B 29/406 (2013.01); C30B 9/10 (2013.01); C30B 29/403 (2013.01); C01B 21/0632 (2013.01); C30B 9/00 (2013.01); C30B 29/38 (2013.01); H01B 1/06 (2013.01); *Y10T 117/1068* (2015.01)

(58) Field of Classification Search
None
See application file for complete search history.

(56) References Cited

U.S. PATENT DOCUMENTS

| 6,949,140 B2 | 9/2005 | Sarayama et al. |
| 7,220,311 B2 | 5/2007 | Iwata et al. |

(Continued)

FOREIGN PATENT DOCUMENTS

| CN | 1612295 A   | 5/2005 |
| CN | 101230489 A | 7/2008 |

(Continued)

OTHER PUBLICATIONS

Hussy et al.; Low-Pressure Solution Growth of GaN Templates with diameters Up to 3 Inches; Journal of Crystal Growth; 310, pp. 738-747; 2008.*

(Continued)

*Primary Examiner* — Guinever S Gregorio
(74) *Attorney, Agent, or Firm* — Cooper & Dunham LLP

(57) ABSTRACT

A method of producing an n-type group III nitride single crystal includes putting raw materials that include at least a substance including a group III element, an alkali metal, and boron oxide into a reaction vessel; melting the boron oxide by heating the reaction vessel to a melting point of the boron oxide; forming a mixed melt which includes the group III element, the alkali metal, and the boron oxide, in the reaction vessel by heating the reaction vessel to a crystal growth temperature of a group III nitride; dissolving nitrogen into the mixed melt by bringing a nitrogen-containing gas into contact with the mixed melt; and growing an n-type group III nitride single crystal, which is doped with oxygen as a donor, from the group III element, the nitrogen, and oxygen in the boron oxide that are dissolved in the mixed melt.

2 Claims, 3 Drawing Sheets

(51) Int. Cl.
*C30B 29/38* (2006.01)
*C01B 21/06* (2006.01)

(56) References Cited

U.S. PATENT DOCUMENTS

| | | |
|---|---|---|
| 7,261,775 B2 | 8/2007 | Iwata et al. |
| 7,368,015 B2 | 5/2008 | D'Evelyn et al. |
| 7,462,238 B2 | 12/2008 | Sarayama et al. |
| 7,718,002 B2 | 5/2010 | Sarayama et al. |
| 7,828,896 B2 | 11/2010 | Iwata et al. |
| 7,981,213 B2 | 7/2011 | Iwata et al. |
| 8,574,525 B2 | 11/2013 | Pimputkar et al. |
| 2003/0226496 A1* | 12/2003 | Melnik .................. C30B 25/00 117/2 |
| 2004/0177801 A1 | 9/2004 | Sakashita et al. |
| 2005/0087753 A1* | 4/2005 | D'Evelyn et al. .............. 257/98 |
| 2005/0098090 A1 | 5/2005 | Hirota et al. |
| 2006/0037529 A1 | 2/2006 | D'Evelyn et al. |
| 2006/0112873 A1 | 6/2006 | Uchida et al. |
| 2006/0150893 A1 | 7/2006 | Uchida et al. |
| 2007/0084399 A1 | 4/2007 | Sarayama et al. |
| 2007/0128746 A1 | 6/2007 | Iwata et al. |
| 2007/0134827 A1* | 6/2007 | Bondokov et al. ............. 438/22 |
| 2007/0215034 A1 | 9/2007 | Iwata et al. |
| 2008/0081015 A1 | 4/2008 | Sarayama et al. |
| 2008/0220346 A1 | 9/2008 | Sarayama et al. |
| 2008/0264331 A1 | 10/2008 | Iwata et al. |
| 2009/0050050 A1* | 2/2009 | Slack et al. ..................... 117/11 |
| 2009/0249997 A1 | 10/2009 | Sarayama et al. |
| 2010/0229787 A1 | 9/2010 | Sarayama et al. |
| 2011/0012235 A1 | 1/2011 | Iwata et al. |
| 2011/0223092 A1 | 9/2011 | Pimputkar et al. |
| 2013/0200432 A1* | 8/2013 | Stau ....................... C30B 25/18 257/183 |

FOREIGN PATENT DOCUMENTS

| | | |
|---|---|---|
| EP | 1538241 A2 | 6/2005 |
| JP | 2005-154254 | 6/2005 |
| JP | 2006-45047 | 2/2006 |
| JP | 2007-246303 | 9/2007 |
| JP | 2008-94704 | 4/2008 |
| JP | 4223540 | 11/2008 |
| JP | 2010-1209 | 1/2010 |
| JP | 4534631 | 6/2010 |
| JP | 4558584 | 7/2010 |
| WO | WO2007/083768 A1 | 7/2007 |

OTHER PUBLICATIONS

Chinese official action (with English translation) dated Sep. 9, 2013 in corresponding Chinese patent application No. 201110254068.9.

Dec. 9, 2011 European search report in connection with counterpart European patent Application No. 11 17 9462.

Senawiratne, J., et al., (2005), "Raman, photoiluminescence and absorption studies on high Quality AlN single crystals," phys. Stat. sol. vol. 2, No. 7, pp. 2274-2278.

Hussy, S., et al., (2008), "Low-pressure solution growth (LPSG) of GaN templates with Diameters up to 3 inch," Journal of Crystal Growth, vol. 310, No. 4, pp. 738-747.

Yamane, Hisanori, et al., (1997), "Preparation of GaN Single Crystals Using a Na Flux," Chemistry of Material, vol. 9, pp. 413-416.

* cited by examiner

METHOD FOR PRODUCING N-TYPE GROUP III NITRIDE SINGLE CRYSTAL, N-TYPE GROUP III NITRIDE SINGLE CRYSTAL, AND CRYSTAL SUBSTRATE

CROSS-REFERENCE TO RELATED APPLICATIONS

This application is a divisional of U.S. application Ser. No. 13/220,939, filed Aug. 30, 2011 which claims priority to and incorporates by reference the entire contents of Japanese Patent Application No. 2010-194552 filed in Japan on Aug. 31, 2010 and Japanese Patent Application No. 2011-151093 filed in Japan on Jul. 7, 2011.

BACKGROUND OF THE INVENTION

1. Field of the Invention

The present invention relates to a method for producing an n-type group III nitride single crystal, an n-type group III nitride single crystal, and a crystal substrate.

2. Description of the Related Art

Currently, InGaAlN-type (group III nitride) devices used as a light source to emit UV light, purple light, blue light, and green light are mostly produced by a production method that includes a step of growing a group III nitride single crystal on a sapphire substrate or a silicon carbide (SiC) substrate by MO-CVD (metal organic chemical vapor deposition), MBE (molecular beam epitaxy) or the like.

However, when a sapphire substrate or a SiC substrate is used as a substrate, there is the problem that the crystal has many defects due to the large difference in the thermal expansion coefficient and in the lattice constant between the substrate and the group III nitride. Consequently, this can cause a deterioration in the device characteristics, such as a shortening in the life of the group III nitride device, which is a light-emitting device. Further, this can also cause the operating power to increase.

To resolve these problems, it is best to use the same material for the substrate and for the crystal to be grown on the substrate, and to grow the crystal on a group III nitride single crystal substrate such as a gallium nitride (GaN) substrate, for example.

In a conventional GaN substrate production method, a thick GaN film is grown by hydride vapor phase epitaxy (HVPE) on an underlayer substrate formed from a different material, such as a sapphire or GaAs substrate, and then the thick GaN film is separated from the underlayer substrate, whereby a GaN substrate having a diameter ($\phi$) of about two inches is produced.

However, in HVPE, since a GaN single crystal is heteroepitaxially grown on the underlayer substrate formed from a different material, there can be unavoidable differences in the thermal expansion coefficient or lattice mismatches between the GaN single crystal and the underlayer substrate. Therefore, a GaN substrate produced by HVPE suffers from having a high dislocation density of about $10^6$ $cm^{-2}$ and that the GaN substrate can become warped due to the difference in thermal expansion coefficient with the underlayer substrate. Therefore, there is a need for a production method that can achieve further improvements in the quality of a GaN substrate.

As a method to produce a high quality GaN substrate, research and development is being carried out into flux methods, in which a GaN single crystal is grown by dissolving nitrogen in a mixed melt of sodium (Na) and gallium (Ga). In a flux method, the GaN single crystal can be grown at a relatively low temperature of 700 to 900° C., and the pressure in the reaction vessel is also relatively low, at about 100 kg/cm². Therefore, a flux method is a practical method for producing GaN single crystals.

In Chemistry of Materials, Vol. 9 (1997) 413-416, an example is reported in which, using sodium azide ($NaN_3$) and Ga as raw materials, a GaN single crystal is grown by sealing nitrogen in a stainless steel reaction vessel and maintaining the reaction vessel at a temperature of 600° C. to 800° C. for 24 to 100 hours. Further, Japanese Patent Application Laid-open No. 2008-094704 discloses a method for producing a large crystal of GaN by using a flux method, in which a columnar crystal of GaN is grown using a needle-like crystal of aluminum nitride (AlN) as a seed crystal. In addition, Japanese Patent Application Laid-open No. 2006-045047 discloses a method for producing an AlN needle-like crystal to be used as a seed crystal. Thus, producing a large crystal of GaN by growing a seed crystal by using a flux method is already a well known technique.

Meanwhile, when using a GaN crystal as a substrate for an optical device, since it is necessary to form an n-side ohmic electrode on the GaN substrate, an n-type GaN semiconductor crystal having an n-type carrier concentration of $10^{17}$ $cm^{-3}$ or more is required. Therefore, growing an n-type GaN crystal by using a flux method by adding (doping) a donor such as oxygen or germanium in the GaN crystal is being investigated.

However, in Japanese Patent No. 4223540 and Japanese Patent Application Laid-open No. 2010-1209, there are the problems that when the doping amount of germanium is increased, the crystal growth rate decreases and the device characteristics deteriorate due to increased absorption of visible light.

Concerning the addition of oxygen, for example, Japanese Patent Application Laid-open No. 2005-154254 discloses a technique in which, using sodium oxide ($Na_2O$) and oxygen gas as the dopants, about $2\times10^{17}$ $cm^{-3}$ of oxygen is doped in a group III nitride crystal. Further, Japanese Patent Application Laid-open No. 2007-246303 discloses a technique in which about $10^{18}$ to $10^{20}$ $cm^{-3}$ of oxygen is doped by including oxygen and moisture in the atmospheric gas in a glove box when preparing the raw materials.

Concerning germanium addition, for example, Japanese Patent No. 4223540 discloses a technique in which about $2\times10^{19}$ $cm^{-3}$ of germanium is added to a group III nitride. Further, Japanese Patent Application Laid-open No. 2010-001209 discloses a technique for producing a low-resistance GaN crystal having an electron concentration of about $5\times10^{19}$ $cm^{-3}$ by simultaneously adding carbon and germanium to dope $2\times10^{17}$ $cm^{-3}$ or more to $1\times10^{20}$ $cm^{-3}$ or less of germanium.

However, Japanese Patent Application Laid-open No. 2005-154254 suffers from the problem that a crystal having a sufficiently large carrier concentration cannot be obtained, which makes it difficult to form a low-resistance ohmic electrode. Further, in Japanese Patent Application Laid-open No. 2007-246303, there is the problem that the production processes are complex, such as need to enclose oxygen and moisture in the reaction vessel in the glove box and seal the vessel. Moreover, even though the oxygen and moisture may only temporarily cause the atmosphere in the glove box to deteriorate, there is the problem that the life of the catalyst which removes the oxygen and the moisture is shortened, which makes it expensive to mass produce the crystal.

Thus, the conventional art suffers from the problem that it is difficult to produce a crystal having a large carrier concentration by efficiently doping oxygen into the crystal because the oxygen is doped using a gas or an oxide that has a higher melting point than the crystal growing temperature. Further, there is also the problem that to obtain a crystal having a large carrier concentration, the apparatus and the production steps become complex.

SUMMARY OF THE INVENTION

It is an object of the present invention to at least partially solve the problems in the conventional technology.

According to an aspect of the present invention, there is provided a method of producing an n-type group III nitride single crystal includes putting at least a substance including a group III element, an alkali metal, and boron oxide into a reaction vessel; melting the boron oxide by heating the reaction vessel to a melting point of the boron oxide; forming a mixed melt which includes the group III element, the alkali metal, and the boron oxide, in the reaction vessel by heating the reaction vessel to a crystal growth temperature of a group III nitride; dissolving nitrogen into the mixed melt by bringing a nitrogen-containing gas into contact with the mixed melt; and growing an n-type group III nitride single crystal, which is doped with oxygen as a donor, from the group III element, the nitrogen, and oxygen in the boron oxide that are dissolved in the mixed melt.

According to another aspect of the present invention, there is provided an n-type group III nitride single crystal that is produced by the method described above.

According to still another aspect of the present invention, there is provided a crystal substrate of an n-type group III nitride that is produced by processing the n-type group III nitride single crystal described above.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
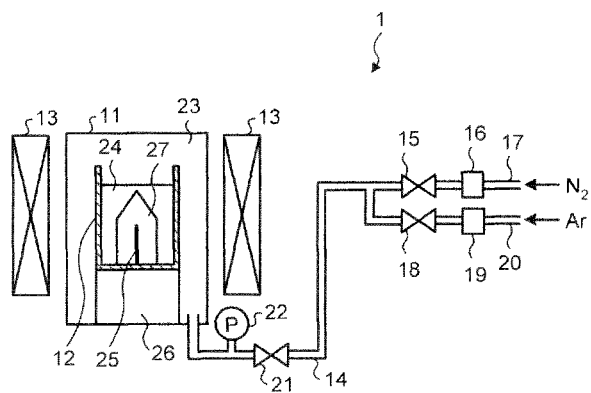
FIG. 1 is a schematic diagram showing a configuration example of a crystal production apparatus for producing an n-type group III nitride single crystal according to the present embodiment.

The method for producing an n-type group III nitride single crystal, the n-type group III nitride single crystal, and the crystal substrate according to the present embodiment will now be described in detail with reference to the accompanying drawings. However, in the following descriptions, the shape, size, and arrangement of the constituent elements are schematically illustrated in the drawings so as to enable the invention to be easily understood. These features do not limit the present invention. Further, identical constituent elements shown in multiple drawings are denoted with the same respective reference numerals, and repetitive descriptions thereof may be omitted.

Crystal Production Apparatus

FIG. 1 is a schematic diagram showing a configuration example of a crystal production apparatus 1 for producing an n-type group III nitride single crystal according to the present embodiment.

As illustrated in FIG. 1, the crystal production apparatus 1 includes a pressure-resistant vessel 11 made from stainless steel, for example, that can form an enclosed space. The pressure-resistant vessel 11 can be removed from the crystal production apparatus 1 at a valve 21 portion. Further, a reaction vessel 12 is arranged on a platform 26 in the pressure-resistant vessel 11. The reaction vessel 12 can be detached from and attached to the platform 26.

The reaction vessel 12 is for growing a group III nitride needle-like crystal 25, which is a seed crystal, by holding the needle-like crystal 25 and a mixed melt 24 that includes raw materials and additives. As this reaction vessel 12, for example, a crucible may be used. The material of the reaction vessel 12 is not especially limited. Examples of materials that can be used include nitrides such as a BN sintered body and pyrolytic-BN (P-BN), oxides such as alumina, sapphire, and yttrium-aluminum-garnet (YAG), and carbides such as SiC. As a preferred embodiment, it is preferred to use a crucible made from a BN sintered body.

Further, as shown in FIG. 1, a heater 13 is arranged near the periphery of the pressure-resistant vessel 11. This heater 13 can be used to adjust the temperature of the mixed melt 24 by heating the pressure-resistant vessel 11 and the reaction vessel 12. As the heater 13, an arbitrary heater may be used as long as it can heat the pressure-resistant vessel 11. For example, a double-sided heating type muffle furnace can be used.

In addition, in the pressure-resistant vessel 11, a gas supply line 14 for supplying nitrogen ($N_2$) gas, which is the raw material for the group III nitride crystal, and dilution gas is connected to an interior space 23 of the pressure-resistant vessel 11. The gas supply line 14 is split into a nitrogen supply line 17 and a dilution gas supply line 20. These supply lines can be disconnected from valves 15 and 18, respectively.

Nitrogen gas is supplied from the nitrogen supply line 17, which is connected to a nitrogen gas cylinder or the like. After adjusting the pressure with a pressure control apparatus 16, the nitrogen gas is supplied to the gas supply line 14 via the valve 15. On the other hand, the dilution gas (for example, argon gas) is supplied from the dilution gas supply line 20, which is connected to a dilution gas cylinder or the like. After adjusting the pressure with a pressure control apparatus 19, the dilution gas is supplied to the gas supply line 14 via the valve 18. Thus, the pressure-adjusted nitrogen gas and dilution gas are each supplied to the gas supply line 14 and mixed.

Then, the mixed gas of nitrogen and the dilution gas is supplied from the gas supply line 14 into the pressure-resistant vessel 11 via the valve 21. Further, a pressure gauge 22 is provided in the gas supply line 14. This pressure gauge 22 allows the pressure in the pressure-resistant vessel 11 to be adjusted while monitoring the total pressure in the pressure-resistant vessel 11.

In this embodiment, the nitrogen partial pressure can be adjusted by adjusting the pressure of the nitrogen gas and the dilution gas with the valves 15 and 18 and the pressure control apparatuses 16 and 19. Further, since the total pressure in the pressure-resistant vessel 11 can be adjusted, evaporation of the alkali metal (for example, sodium) in the reaction vessel 12 can be suppressed by increasing the total pressure in the pressure-resistant vessel 11.

Although it is preferred to use argon (Ar) gas as the dilution gas, some other inert gas may also be used.

Crystal Production Method (1) Raw Material Preparation

In the method for producing the n-type group III nitride single crystal according to this embodiment, a single crystal ingot is produced using a needle-like crystal of a group III nitride as a seed crystal by further growing the needle-like crystal by using a flux method so that the single crystal ingot is used for producing a nitride crystal substrate.

The operation for putting the raw materials and additives into the reaction vessel 12 is carried out by disconnecting the pressure-resistant vessel 11 from the valve 21, and placing the disconnected pressure-resistant vessel 11 in a glove box filled with an inert gas such as argon gas.

As the constituent materials of the mixed melt 24, at least a substance including a group III element (for example, gallium), an alkali metal to act as a flux (for example, sodium), and boron oxide (for example, boron trioxide ($B_2O_3$)) are put into the reaction vessel 12 (material putting step).

The melting point of the boron oxide is lower than crystal growth temperature of the group III nitride (for example, the crystal growth temperature of gallium nitride is about 700 to 900° C.). As an example, the melting point of boron trioxide ($B_2O_3$) is 480° C. Therefore, the boron oxide melts at the crystal growth temperature, so that oxygen and boron are added to the mixed melt 24 formed in the reaction vessel 12. Consequently, when growing the group III nitride single crystal by using a flux method, oxygen acting as an n-type dopant and boron form a solid solution in the group III nitride single crystal, enabling an n-type group III nitride single crystal 27 to grow.

In this embodiment, since boron oxide that is a liquid at the crystal growth temperature is used as the oxygen dopant raw material substance, the oxygen can be more easily dissolved in the mixed melt 24 than when a gas (for example, oxygen gas) or a high melting point oxide (for example, sodium oxide ($Na_2O$)) is used as the oxygen dopant raw material substance. Consequently, the oxygen can be efficiently doped in the crystal, so that the oxygen concentration in the crystal can be efficiently increased. Therefore, there is the advantageous effect that the n-type group III nitride single crystal 27 can be produced that has a high carrier concentration and a low resistance.

Further, in this embodiment, since boron oxide, which is a compound of boron of the group III element, is used as an additive raw material, carrier doping can be carried out without reducing the n-type carrier concentration.

Specifically, when elements having different valencies form a solid solution in the crystal, since the charge balance (charge neutrality) in the crystal breaks down, the valence electrons of oxygen (oxide ions) are used up in order to maintain the charge balance. More specifically, the carrier concentration decreases because the oxygen valence electrons are used up, so that the resistance of the n-type group III nitride single crystal increases.

In contrast, in this embodiment, the boron to be added belongs to the same group as the raw material group III element (for example, gallium), and thus has the same valence. Therefore, when the boron is in solid solution in the group III nitride crystal, the charge balance does not break down. Thus, the oxygen valence electrons are not used up to maintain the charge balance, and the carrier concentration in the crystal can be maintained at a high level. Accordingly, in this embodiment, an n-type group III nitride single crystal can be produced that has a high carrier concentration and a low resistance.

As a preferred embodiment, it is preferred that the boron oxide ($B_2O_3$) content be 0.001 mol % or more based on the group III element content. As a more preferred embodiment, it is preferred that the boron oxide ($B_2O_3$) content be 0.01 mol % or more and less than 0.22 mol % based on the group III element content. As an even more preferred embodiment, it is preferred that the boron oxide ($B_2O_3$) content be about 0.01 to 0.1 mol % based on the group III element content (refer to the Examples).

According to the above preferred embodiments, the concentration of the n-type dopant oxygen in the crystal of the n-type group III nitride single crystal 27 can be set at about $10^{17}$ cm$^{-3}$ to $10^{20}$ cm$^{-3}$, so that an n-type group III nitride single crystal 27 can be produced that has a high carrier concentration of $10^{17}$ cm$^{-3}$ or more and a low resistance.

As the raw material substance including a group III element, gallium (Ga) of the group III element may be used for example. Alternatively, other group III elements such as aluminum and indium, or a mixture thereof may be used.

Examples of the alkali metal used as a flux include, in addition to sodium (Na) or a sodium compound (for example, sodium azide), other alkali metals such as lithium and potassium, and compounds of such alkali metals. Multiple types of alkali metals may also be used.

The molar ratio of the substance including the group III element and the alkali metal is not especially limited. However, it is preferred that the molar ratio of the alkali metal based on the total number of moles of the group III element and the alkali metal be 40 to 95%. As a more preferred embodiment, the molar ratio of the group III element (for example, Ga) and the alkali metal (for example, Na) is preferably 0.4:0.6.

As a preferred embodiment, it is preferred to set the molar ratio of the group III element and the alkali metal to 0.4:0.6, and boron oxide ($B_2O_3$) to 0.04 mol % to 0.1 mol % based on the group III element (refer to the Examples).

The needle-like crystal 25 of the group III nitride is placed in the reaction vessel 12 as a seed crystal. As a preferred embodiment, it is preferred to use a needle-like crystal of gallium nitride obtained by using a flux method as the seed crystal. Since the needle-like crystal 25 that is produced by using a flux method has a low dislocation density and is of a high quality, when the n-type group III nitride single crystal 27 is grown using this seed crystal, dislocation propagation from the seed crystal is low, which allows a high quality crystal to be grown. Concerning the production method of the needle-like crystal by using a flux method, a similar method to those used in the convention art may be used.

Figure 2:
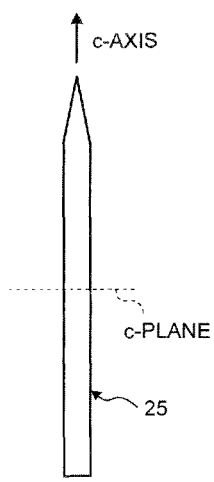
FIG. 2 is a pattern diagram illustrating the c-axis and the c-plane of a group III nitride single crystal.

FIG. 2 is a schematic diagram showing a needle-like crystal 25 of a group III nitride used as a seed crystal in this embodiment. In this embodiment, an n-type group III nitride single crystal 27 is grown using a needle-like crystal 25 of a group III nitride, which is long in the c-axis direction as shown in FIG. 2, as a seed crystal. In this embodiment, the needle-like crystal 25 of a group III nitride and the n-type group III nitride single crystal 27 have a hexagonal crystal structure. The c-plane has the same definition as the {0001} plane, and the m-plane (see FIG. 3) has the same definition as the {10-10} plane.

Figure 3:
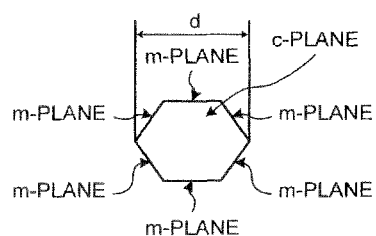
FIG. 3 is a pattern diagram illustrating the c-plane.

FIG. 3 is a cross sectional view of the c-plane orthogonal to the c-axis shown in FIG. 2. As shown in FIG. 3, the maximum diameter of the c-plane is referred to as the "crystal diameter d". More specifically, the crystal diameter d is the length of the longest diagonal in the hexagon forming the c-plane. In this embodiment, using the needle-like crystal 25 of a group III nitride, the crystal diameter d is increased by growing the needle-like crystal 25 in the radial direction orthogonal to the c-axis, whereby the area of the c-plane is increased in size.

In this embodiment, the n-type group III nitride single crystal 27 is produced by using a flux method, which is the same method as that used to produce the needle-like crystal 25. Therefore, compared with when using a different method than that used to produce the needle-like crystal 25, there is an improvement in the consistency of the lattice constant and the thermal expansion coefficient between the needle-like crystal 25 and the n-type group III nitride single crystal 27. Further, dislocations that occur when the n-type group III nitride single crystal 27 is grown from the needle-like crystal 25 can be suppressed.

After the raw materials and the like have been thus added, the reaction vessel 12 is placed in the pressure-resistant vessel 11. To carry out the operation for preparing the raw materials in a glove box having an inert gas atmosphere, the pressure-resistant vessel 11 is filled with the inert gas. By operating the valve 21, the pressure-resistant vessel 11 is connected to the crystal production apparatus 1.

(2) Growing the Group III Nitride Single Crystal

After the raw materials and the like have thus been set in the pressure-resistant vessel 11, the heater 13 is turned on to heat the pressure-resistant vessel 11 and the reaction vessel 12 thereinside. Since the melting point of the boron oxide is lower than the crystal growth temperature in this embodiment, during the process of heating the reaction vessel 12 to the crystal growth temperature, the temperature in the reaction vessel 12 reaches the melting point of the boron oxide, and consequently, the boron oxide melts and turns into a liquid (melting step).

Further, by heating the reaction vessel 12 to the crystal growth temperature, the substance including a group III element, the alkali metal, and the oxide that were put into the reaction vessel 12 dissolve. Consequently, the mixed melt 24 including the group III element, the alkali metal, and the boron oxide is formed in the reaction vessel 12 (mixed melt forming step).

The temperature of the mixed melt 24 during the mixed melt forming step is not especially limited. However, as a preferred embodiment, it is preferred to set the temperature to at least 700° C. or more. As a more preferred embodiment, it is preferred to set the temperature to about 860° C. to 900° C. (refer to the Examples).

Further, the nitrogen gas and the dilution gas are adjusted to desired gas partial pressures by regulating the valves 15 and 18 and the pressure control apparatuses 16 and 19. Then, the valve 21 is opened and the mixed gas is introduced into the pressure-resistant vessel 11. Consequently, the nitrogen in the gas that is brought into contact with the mixed melt 24 in the pressure-resistant vessel 11 dissolves in the mixed melt 24 (nitrogen dissolving step). Although the nitrogen partial pressure in the gas is not especially limited, it is preferred to set it to at least 0.1 MPa or more. As a more preferred embodiment, it is preferred to set the nitrogen partial pressure to about 6 MPa, and the total pressure of the interior space 23 in the pressure-resistant vessel 11 to about 8 MPa (refer to the Examples).

As a more preferred embodiment, regarding the raw materials, it is preferred to set the molar ratio of the group III element and the alkali metal to 0.4:0.6 and the boron oxide ($B_2O_3$) to 0.04 mol % to 0.1 mol % based on the group III element, and regarding the crystal growth atmosphere, it is preferred to set the crystal growth temperature of the mixed melt 24 to about 900° C., the nitrogen partial pressure to about 6 MPa, and the total pressure of the interior space 23 in the pressure-resistant vessel 11 to about 8 MPa (refer to the Examples).

By setting the above crystal growth conditions, an n-type group III nitride single crystal 27, in which the group III element, nitrogen, oxygen, and boron dissolved in the mixed melt 24 form a solid solution, grows from the needle-like crystal 25 acting as a seed crystal (crystal growing step).

More specifically, the boron oxide decomposes in the mixed melt 24 or near the crystal growth face (surface) of the n-type group III nitride single crystal 27 into oxide ions and boron ions. Consequently, oxygen and boron are in solid solution (are doped) in the crystal. Further, since oxygen (oxide ions) having a negative change of 2 is doped in the crystal, the grown group III nitride is an n-type semiconductor crystal.

In the above description, although the n-type group III nitride single crystal 27 was grown using a non-doped group III nitride needle-like crystal 25 as a seed crystal, the crystal production method is not limited to this. As another example, the n-type group III nitride single crystal may be produced using formation of crystal nucleus from the mixed melt 24 without placing a seed crystal in the reaction vessel 12, and then further growing the crystal nucleus. In addition, the n-type group III nitride single crystal, in which the entire crystal is an n-type semiconductor, may also be produced by carrying out the same crystal growth step as above using the crystal nucleus as a seed crystal.

As described above, according to this embodiment, oxygen can be easily doped in a crystal by putting boron oxide that has a lower melting point than the crystal growth temperature of a group III nitride (for example, gallium nitride) into the reaction vessel 12. Therefore, based on a simple process, oxygen can be efficiently doped in the crystal, so that there is the advantageous effect that an n-type group III nitride single crystal can be produced that has a high carrier concentration and a low resistance.

Crystal Substrate Production Steps

Figure 4:
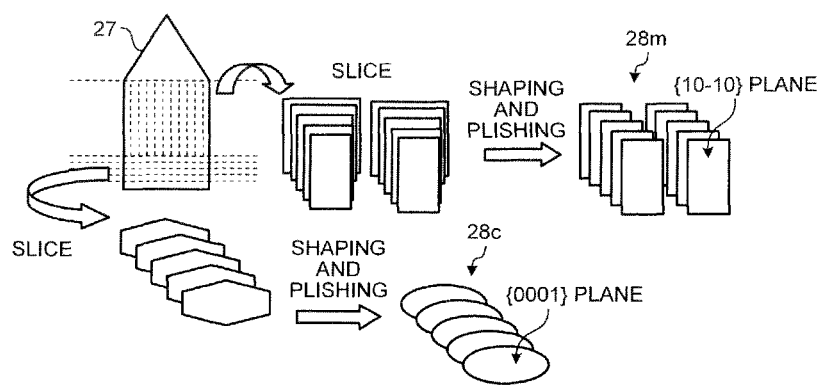
FIG. 4 is a process diagram showing the production steps for producing a crystal substrate according to the present embodiment.

A crystal substrate of the n-type group III nitride according to this embodiment can be produced by shaping and processing the thus-obtained n-type group III nitride single crystal 27. FIG. 4 is a process diagram illustrating the production steps of crystal substrates 28m and 28c (hereinafter, unless otherwise noted, referred to as "crystal substrate 28") according to this embodiment.

As shown in FIG. 4, if the n-type group III nitride single crystal 27 is sliced in a direction perpendicular to the radial direction of the crystal, specifically, a direction perpendicular to the c-plane, and the slice is shaped and then its surface is polished, a crystal substrate 28m with a large surface area and having a nonpolar m-plane ({10-10} plane) as a main plane is obtained.

Moreover, if the n-type group III nitride single crystal 27 is sliced in a direction parallel to the radial direction of the crystal, specifically, parallel to the c-plane, and the slice is shaped and then its surface is polished, a crystal substrate 28c with a large surface area and having a polar c-plane ({0001} plane) as a main plane is obtained.

Thus, based on the production steps according to this embodiment, the practical crystal substrate 28 (28m and 28c) with a large surface area can be produced that is capable of being used in an optical device or other semiconductor devices. Further, the crystal substrate 28 can be produced for either the m- or c-plane.

In addition, if the n-type group III nitride single crystal is grown in the manner described above using a cut crystal substrate 28m or 28c as a seed crystal, a single crystal wafer having a high quality and a large surface area can be mass produced for both m- and c-planes.

Still further, since the n-type group III nitride single crystal 27 produced by the above-described crystal production method has a low dislocation density and a low resistance, the crystal substrate 28 obtained by processing this n-type group III nitride single crystal 27 also has a low dislocation density and a low resistance. Therefore, according to this embodiment, based on a simple process, a crystal substrate 28 of an n-type group III nitride that has a high quality and a low resistance can be produced. In addition, an ohmic electrode that has a high quality and a low resistance can be formed using this crystal substrate 28.

EXAMPLES

The present invention will now be described in more detail based on the following examples. However, the present invention is not limited to the following examples.

Example 1

In this example, using the GaN needle-like crystal 25 as a seed crystal, the n-type GaN single crystal 27 doped with oxygen was grown. These reference numerals correspond to the structures in the crystal production apparatus 1 described with reference to FIG. 1.

First, the pressure-resistant vessel 11 was separated from the crystal production apparatus 1 at the valve 21 portion, and the pressure-resistant vessel 11 was placed in a glove box having an Ar atmosphere.

Then, gallium (Ga), sodium (Na), and boron oxide ($B_2O_3$) were put into the reaction vessel 12 formed from a BN sintered body and having an inner diameter of 55 mm. In this example, the gallium-sodium molar ratio was 0.4:0.6. The added amount of the boron oxide ($B_2O_3$) was 0.1 mol % based on the amount of gallium.

Further, a seed crystal was placed in the reaction vessel 12. The needle-like crystal 25, which was long in the c-axis direction and had a hexagonal columnar needle shape with {10-10} plane (m-plane) side faces, was used as this seed crystal. The c-axis length of the needle-like crystal 25 (the height of the needle-like crystal 25) was 20 mm. The diameter of the cross-section perpendicular to the c-axis was 500 μm.

Next, the pressure-resistant vessel 11 was hermetically sealed, the valve 21 was closed, and the interior of the reaction vessel 12 was blocked off from the external atmosphere. Since this series of operations is carried out in a glove box having a high-purity Ar atmosphere, the interior of the pressure-resistant vessel 11 is filled with Ar gas. Then, the pressure-resistant vessel 11 was removed from the glove box, and attached to the crystal production apparatus 1. More specifically, the pressure-resistant vessel 11 was arranged at a predetermined position in a heating zone of the heater 13, and connected to the nitrogen and argon gas supply line 14 at the valve 21 portion.

Next, the valves 21 and 18 were opened, Ar gas was fed in from the dilution gas supply line 20, the pressure was adjusted using the pressure control apparatus 19 so that the total pressure in the pressure-resistant vessel 11 was 0.75 MPa, and then the valve 18 was closed. Further, nitrogen gas was fed in from the nitrogen supply line 17, the pressure was adjusted using the pressure control apparatus 16, and then the valve 15 was opened so that the total pressure in the pressure-resistant vessel 11 was 3 MPa. More specifically, the partial pressure of nitrogen in the interior space 23 of the pressure-resistant vessel 11 was 2.25 MPa. Subsequently, the valve 15 was closed, and the pressure control apparatus 16 was set at 8 MPa.

Next, the heater 13 was turned on to increase the temperature in the reaction vessel 12 to 900° C., which is the crystal growth temperature. At the crystal growth temperature, the gallium and sodium in the reaction vessel 12 melt and form a mixed melt 24. The temperature of this mixed melt 24 is the same temperature as the reaction vessel 12. Further, when the temperature increases to 900° C., in the crystal production apparatus 1 according to this example, the gas pressure in the interior space 23 of the pressure-resistant vessel 11 increases due to the increase in temperature. Therefore, the total pressure becomes 8 MPa. More specifically, the nitrogen partial pressure becomes 6 MPa.

Next, the nitrogen partial pressure was adjusted to 8 MPa by opening the valve 15. This was done in order to maintain the nitrogen partial pressure in the pressure-resistant vessel 11 at 6 MPa by externally supplying nitrogen even when the nitrogen is consumed by the growth of gallium nitride crystals. While maintaining this state for 1,000 hours, nitrogen was continuously dissolved in the mixed melt 24 to grow the n-type GaN single crystal 27.

After 1,000 hours, the temperature of the reaction vessel 12 was lowered to room temperature. Then, the gas pressure in the pressure-resistant vessel 11 was reduced. When the pressure-resistant vessel 11 was opened, an n-type GaN single crystal 27 had grown using the GaN needle-like crystal 25 as a seed crystal, in the reaction vessel 12.

The obtained n-type GaN single crystal 27 was colorless and transparent, and had an outer diameter of 20 mm, and a c-axis length (height of the n-type GaN single crystal 27) of 47 mm. The top portion of the n-type GaN single crystal 27 was a hexagonal spindle shape formed from a {10-11} plane. The bottom portion of the crystal was a hexagonal columnar shape whose sides were formed from m-planes ({10-10} planes).

Next, a plate-like crystal having an m-plane ({10-10} plane) as a main plane and a plate-like crystal having a c-plane ({0001} plane) as a main plane were cut from the hexagonal columnar portion of the n-type GaN single crystal 27 and shaped. Then, the surfaces of these crystals were polished to produce GaN crystal substrates 28m and 28c.

Consequently, 10 of the crystal substrates 28m having an m-plane as a main plane and 5 of the crystal substrates 28c having a c-plane as a main plane were produced. The crystal substrates 28m were 10 mm long, 20 mm wide, and 0.4 mm thick, and the crystal substrates 28c had an outer diameter φ of 16 mm and a thickness of 0.4 mm.

The crystal substrates 28c were etched with an acidic solution. When observed, the density of the etched pits was $10^3$ cm$^{-2}$ or less, showing that the substrates had a low dislocation density and were of a high quality.

In addition, when the crystal substrates 28 were subjected to elemental analysis by SIMS (secondary ionization mass spectrometry), oxygen (O) and boron (B) were detected. The oxygen concentration in the crystal substrates 28 was $3\times10^{19}$ cm$^{-3}$ to $1\times10^{20}$ cm$^{-3}$, with a mean of $8\times10^{19}$ cm$^{-3}$. The boron concentration was $3\times10^{17}$ cm$^{-3}$ to $3\times10^{18}$ cm$^{-3}$, with a mean of $1\times10^{18}$ cm$^{-3}$.

Further, when the electrical conductivity of the crystal substrates 28 was measured, n-type electrical conductivity was exhibited, showing that the substrates had a low resistance.

Example 2

In this example, an n-type GaN single crystal was grown under the same experiment conditions as Example 1, except that the added amount of the boron oxide ($B_2O_3$) was 0.04 mol % based on the amount of gallium.

The obtained GaN single crystal was processed in the same manner as in Example 1 to produce GaN crystal substrates. Observation of the GaN crystal substrates showed that the substrates had a high quality, with an etched pit density of $10^3$ cm$^{-2}$ or lower and a low dislocation density. Further, the results of SIMS analysis showed that the mean oxygen concentration in the GaN crystal substrate was $2 \times 10^{19}$ cm$^{-3}$ and that the mean boron concentration was $1 \times 10^{18}$ cm$^{-3}$. In addition, based on the results of measuring the electrical conductivity of the GaN crystal substrate, n-type electrical conductivity was exhibited, and the resistance was low.

Example 3

Figure 5:
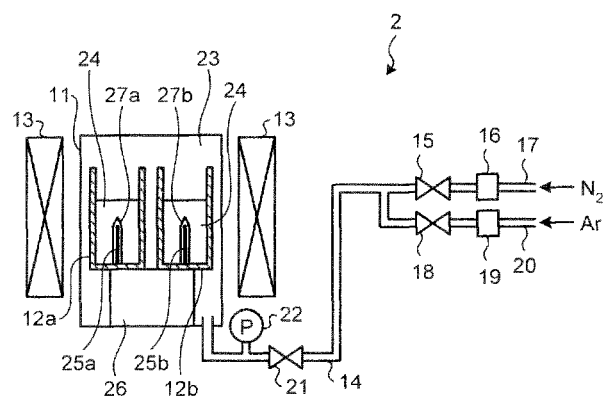
FIG. 5 is a schematic diagram showing the configuration of a crystal production apparatus according to Example 3.

FIG. 5 is a schematic diagram illustrating a configuration of a crystal production apparatus 2 according to Example 3. In this example, five reaction vessels 12 (12a to 12e) having an inner diameter of 17 mm were arranged in the pressure-resistant vessel 11. GaN needle-like crystals 25 (25a to 25e) were placed in these reaction vessels 12a to 12e, respectively, and then the needle-like crystals 25a to 25e were grown.

Although FIG. 5 only illustrates the two reaction vessels 12a and 12b, in actual fact the reaction vessels 12c to 12e were also arranged in the pressure-resistant vessel 11. Further, as the needle-like crystals 25a to 25e, GaN single crystals having the same crystal properties and size as the needle-like crystal 25 used in Example 1 were used.

In this example, the crystals were grown using different amounts of boron oxide ($B_2O_3$) put into the respective reaction vessels 12a to 12e. More specifically, no boron oxide was put into one of the reaction vessels 12, while the amounts of boron oxide ($B_2O_3$) put into the respective remaining four reaction vessels 12 were, based on gallium, 0.01 mol %, 0.04 mol %, 0.10 mol %, and 0.22 mol %, respectively.

Further, the GaN single crystals 27 (27a to 27e) were respectively grown in the reaction vessels 12a to 12e under the same experiment conditions as Example 1 while maintaining the reaction vessels 12a to 12e at the crystal growing temperature of 900° C. for 80 hours.

The obtained GaN single crystals 27a to 27e each had the same shape as that in Example 1, in which the top portion of the crystal was a hexagonal spindle shape formed from the {10-11} plane and the bottom portion of the crystal was a hexagonal columnar shape whose sides were formed from the m-plane ({10-10} plane).

Further, a GaN crystal having a thickness of about several hundred μm had grown on each surface of the seed crystals 25a to 25e. The greater the added amount of boron oxide ($B_2O_3$), the greater the thickness of the GaN crystal that grew on the seed crystal 25.

The GaN single crystals 27 grown by adding 0.01 mol %, 0.04 mol %, and 0.10 mol % of boron oxide ($B_2O_3$) and the GaN single crystal 27 grown without adding boron oxide ($B_2O_3$) were all transparent. In contrast, the GaN single crystal 27 grown by adding 0.22 mol % of boron oxide ($B_2O_3$) was colored black.

The oxygen and boron concentrations in the GaN single crystals 27a to 27e were measured by SIMS. The m-planes ({10-10}), which are the side faces of the GaN single crystals 27a to 27e, were analyzed as the target face. In some cases the concentrations were measured a plurality of times in the same GaN single crystal 27 while changing the target location.

Figure 6:
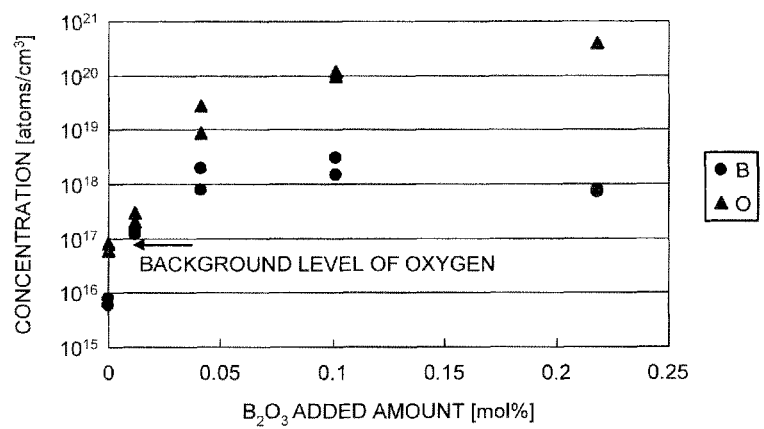
FIG. 6 is a graph showing a relationship between the added amount of boron oxide and the concentrations of oxygen and boron in a GaN single crystal.

FIG. 6 is a graph showing the relationship between the added amount of boron oxide ($B_2O_3$) and the concentrations of oxygen (O) and boron (B) in the GaN single crystals 27a to 27e. In the graph, the horizontal axis represents the added amount of boron oxide ($B_2O_3$) as a function of the molar fraction of boron oxide ($B_2O_3$) based on gallium.

(1) Crystal Oxygen Concentration

As shown in FIG. 6, the oxygen concentration in the GaN single crystal 27 that was grown without adding boron oxide ($B_2O_3$) was $8 \times 10^{16}$ cm$^{-3}$, which was the background value of oxygen during the measurement. Further, when 0.01 mol % of boron oxide ($B_2O_3$) was added, the oxygen concentration in the GaN single crystal 27 was about $10^{17}$ cm$^{-3}$. When 0.22 mol % of boron oxide ($B_2O_3$) was added, the oxygen concentration in the GaN single crystal 27 was about $4 \times 10^{20}$ cm$^{-3}$. Therefore, it can be seen that about $10^{17}$ cm$^{-3}$ to $4 \times 10^{20}$ cm$^{-3}$ of oxygen can be doped in the GaN single crystal 27 by adding 0.01 mol % to 0.22 mol % of boron oxide ($B_2O_3$) to grow the crystal.

Further, as shown in FIG. 6, it can be seen that when the added amount of the boron oxide ($B_2O_3$) is less than 0.01 mol %, oxygen can be doped in the GaN single crystal 27 to a level less than about $10^{17}$ cm$^{-3}$. In addition, based on the relationship shown in FIG. 6 between the added amount of boron oxide ($B_2O_3$) and the oxygen concentration in the GaN single crystal 27, and the oxygen background value, for example, it can be estimated that when about 0.001 mol % of boron oxide ($B_2O_3$) is added, which is one order less than 0.01 mol %, about $10^{16}$ cm$^{-3}$ of oxygen can be doped in the GaN single crystal 27.

(2) Crystal Boron Concentration

As shown in FIG. 6, when 0.01 mol % of boron oxide ($B_2O_3$) was added, the boron concentration in the GaN single crystal 27 was about $10^{17}$ cm$^{-3}$. When 0.1 mol % of boron oxide ($B_2O_3$) was added, the boron concentration in the GaN single crystal 27 was about $3 \times 10^{18}$ cm$^{-3}$. Therefore, it can be seen that about $10^{17}$ cm$^{-3}$ to $3 \times 10^{15}$ cm$^{-3}$ of boron can be doped in the GaN single crystal 27 by adding 0.01 mol % to 0.22 mol % of boron oxide ($B_2O_3$) to grow the crystal.

Further, about $6 \times 10^{15}$ cm$^{-3}$ of boron was detected even in the GaN single crystal 27 that was grown without adding boron oxide. Since the material of the reaction vessel 12 is boron nitride (BN), this is thought to be due to the incorporation of boron (B) that had eluted from the reaction vessel 12 into the GaN single crystal 27 during crystal growth.

Thus, it can be seen that when the added amount of the boron oxide ($B_2O_3$) is less than 0.01 mol %, boron can be doped in the GaN single crystal 27 to a level less than about $10^{17}$ cm$^{-3}$. In addition, based on the relationship shown in FIG. 6 between the added amount of boron oxide ($B_2O_3$) and the boron concentration in the GaN single crystal 27, for example, it can be estimated that when about 0.001 mol % of boron oxide ($B_2O_3$) is added, which is one order less than 0.01 mol %, about $10^{16}$ cm$^{-3}$ of boron can be doped in the GaN single crystal 27.

(3) Electrical Conductivity

The electrical conductivity of the GaN single crystals 27 (27a to 27e) was measured. Based on the results, it can be seen that the GaN single crystals 27 exhibit n-type electrical conductivity. Further, it can be seen that as the added amount of the boron oxide ($B_2O_3$) is increased, the electrical conductivity increases and resistance decreases. This is thought to be due to the oxygen doped in the GaN single crystals 27 acting as a donor.

This example shows a clear trend for the resistance of the GaN single crystal 27 to decrease as the added amount of boron oxide ($B_2O_3$) is increased until an added amount of 0.01 mol %. On the other hand, when the added amount of boron oxide ($B_2O_3$) exceeds 0.01 mol %, the trend (rate of change) for the resistance to decrease lessens. More specifically, although the resistance of the GaN single crystal 27 obtained by adding 0.22 mol % of boron oxide ($B_2O_3$) is slightly less than the resistance of the GaN single crystal 27 obtained by adding 0.01 mol % of boron oxide ($B_2O_3$), this amount of decrease is small enough for the resistances to be called roughly the same.

Thus, in this example, based on a simple process, a high quality, low resistance n-type group III nitride single crystal could be produced.

According to the present invention, oxygen can be easily doped into a crystal by putting boron oxide having a lower melting point than the crystal growth temperature of a group III nitride (for example, gallium nitride) into a reaction vessel. Therefore, the present invention provides the advantageous effects that, by a simple process, oxygen can be efficiently doped into a crystal, and an n-type group III nitride single crystal that has a high carrier concentration and a low resistance can be produced.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A nitride crystal, comprising:
a first portion of a gallium nitride single crystal which is doped with oxygen at a concentration of $10^{17}$ $cm^{-3}$ or more and boron at a concentration of $10^{17}$ $cm^{-3}$ or more, the first portion including a prismatic shape portion; and
a second portion, which is different from the gallium nitride single crystal in oxygen concentration or boron concentration and is surrounded by the gallium nitride single crystal.

2. A nitride crystal, comprising:
a first portion of a gallium nitride single crystal which is doped with oxygen at a concentration of $10^{17}$ $cm^{-3}$ or more and boron at a concentration of from $10^{17}$ $cm^{-3}$ to $3 \times 10^{18}$ $cm^{-3}$; and
a second portion, which has a different oxygen concentration or boron concentration from the gallium nitride single crystal and is surrounded by the gallium nitride single crystal.

* * * * *